United States Patent
Hosko et al.

(10) Patent No.: US 12,166,341 B2
(45) Date of Patent: Dec. 10, 2024

(54) TRIP UNIT WITH HIGH-LOAD ANALYSIS

(71) Applicant: EATON INTELLIGENT POWER LIMITED, Dublin (IE)

(72) Inventors: Daniel A. Hosko, Pittsburgh, PA (US); James L Lagree, Robinson Township, PA (US); Donald T. McComas, Oakdale, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 118 days.

(21) Appl. No.: 17/514,266

(22) Filed: Oct. 29, 2021

(65) Prior Publication Data

US 2023/0133287 A1 May 4, 2023

(51) Int. Cl.
*H02H 3/04* (2006.01)
*G01R 31/52* (2020.01)
*H01H 83/04* (2006.01)

(52) U.S. Cl.
CPC .............. *H02H 3/04* (2013.01); *G01R 31/52* (2020.01); *H01H 83/04* (2013.01)

(58) Field of Classification Search
CPC ........... H02H 3/04; G01R 31/52; H01H 83/04
USPC .......................................................... 361/42
See application file for complete search history.

(56) References Cited

U.S. PATENT DOCUMENTS

| 4,752,853 | A | * | 6/1988 | Matsko | H02H 3/006 361/97 |
| 4,827,369 | A | * | 5/1989 | Saletta | H02H 1/063 361/96 |
| 5,311,392 | A | * | 5/1994 | Kinney | H02H 3/0935 361/87 |
| 5,644,238 | A | * | 7/1997 | Seifert | G01R 1/40 324/132 |
| 10,955,447 | B2 | * | 3/2021 | Takemura | G01R 19/2513 |

FOREIGN PATENT DOCUMENTS

| EP | 3 771 056 A1 | 1/2021 |
| KR | 101713076 B1 | 12/2017 |
| WO | WO-2019234927 A1 * | 12/2019 |

OTHER PUBLICATIONS

European Patent Office, "extended European search report", for corresponding European Patent Application No. 22203082.7, dated Mar. 20, 2023, 8 pp.

* cited by examiner

*Primary Examiner* — Thienvu V Tran
*Assistant Examiner* — Sreeya Sreevatsa
(74) *Attorney, Agent, or Firm* — Eckert Seamans Cherin & Mellott, LLC

(57) ABSTRACT

Systems and methods for providing detailed information about high load events in a circuit interrupter are disclosed. The systems and methods provide a user with information such as the maximum high load current reached during a high load event and the average high load current calculated for the duration of the event. In addition, detailed waveform and metered data captures are generated in order to provide a comprehensive cycle-level and/or sub-cycle level overview of the event.

12 Claims, 4 Drawing Sheets

TRIP UNIT WITH HIGH-LOAD ANALYSIS

BACKGROUND

Field

The disclosed concept relates generally to circuit interrupters, and in particular, to capturing information about high-load events in a circuit interrupter.

Background Information

Circuit interrupters, such as for example and without limitation, circuit breakers, are typically used to protect electrical circuitry from damage due to an overcurrent condition, such as an overload condition, a short circuit, or another fault condition, such as an arc fault or a ground fault. Circuit breakers typically include separable contacts. The separable contacts may be operated either manually by way of an operator handle or automatically in response to a detected fault condition. Typically, such circuit breakers include an operating mechanism, which is designed to rapidly open and close the separable contacts, and a trip mechanism, such as a trip unit, which senses a number of fault conditions to trip the breaker automatically. Upon sensing a fault condition, the trip unit causes the operating mechanism to trip open the separable contacts.

One type of event that can cause a circuit breaker trip unit to initiate a trip is a high load that draws current in excess of the rated breaker current. Circuit breakers typically include some type of mechanism for indicating that a high load condition has occurred, however, these mechanisms generally only indicate the time of the occurrence and a snapshot of RMS currents measured at the starting time of the high load condition. These snapshots do not provide detailed information about the duration of the high-load condition or the characteristics of the current profile over that duration. Such detailed information is important to have, as sustained high load conditions are likely to be indicative of more serious issues with the circuit breaker load setup than transient high load conditions are.

There is thus room for improvement in capturing information about high load events in circuit interrupters.

SUMMARY

These needs and others are met by embodiments of the disclosed concept in which an electronic trip unit for a circuit interrupter provides detailed information about conditions present during high load events in a circuit interrupter. The trip unit compiles the metrics of a high load event using data collected throughout the duration of the event.

In accordance with one aspect of the disclosed concept, an electronic trip unit for a circuit interrupter comprises: a processor with a timer and structured to receive an output of a current sensor sensing current flowing through a busbar of the circuit interrupter, and a user interface. The processor is configured to detect a high load condition in the circuit interrupter based on the sensed current, and to capture a plurality of metrics of the high load condition. The plurality of metrics are based on data captured throughout the entire duration of the high load condition, and the processor is configured to display the plurality of metrics on the user interface.

In accordance with another aspect of the disclosed concept, a circuit interrupter comprises: a first terminal and a second terminal; a busbar disposed between the first terminal and the second terminal; separable contacts structured to be moveable between a closed position and an open position, the first and second terminals being electrically disconnected from each other when the separable contacts are in the open position; an operating mechanism structured to open and close the separable contacts; a current sensor configured to sense current flowing through the busbar; a user interface; and an electronic trip unit structured to actuate the operating mechanism. The electronic trip unit comprises a processor with a timer and is structured to receive an output of the current sensor. The processor is configured to detect a high load condition in the circuit interrupter based on the sensed current, and to capture a plurality of metrics of the high load condition. The plurality of metrics are based on data captured throughout the entire duration of the high load condition, and the processor is configured to display the plurality of metrics on the user interface.

In accordance with another aspect of the disclosed concept, a method of informing a user of a circuit interrupter that a high load condition is present in the circuit interrupter comprises: providing a current sensor structured to sense current flowing through a busbar of the circuit interrupter; providing an electronic trip unit, the electronic trip unit being structured to receive an output of the current sensor, and comprising a processor with a timer and a user interface; detecting, with the processor, a high load condition in the circuit interrupter based on the sensed current; capturing, with the processor, a plurality of metrics of the high load condition; and displaying the plurality of metrics on the user interface, wherein the plurality of metrics are based on data captured throughout the entire duration of the high load condition.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
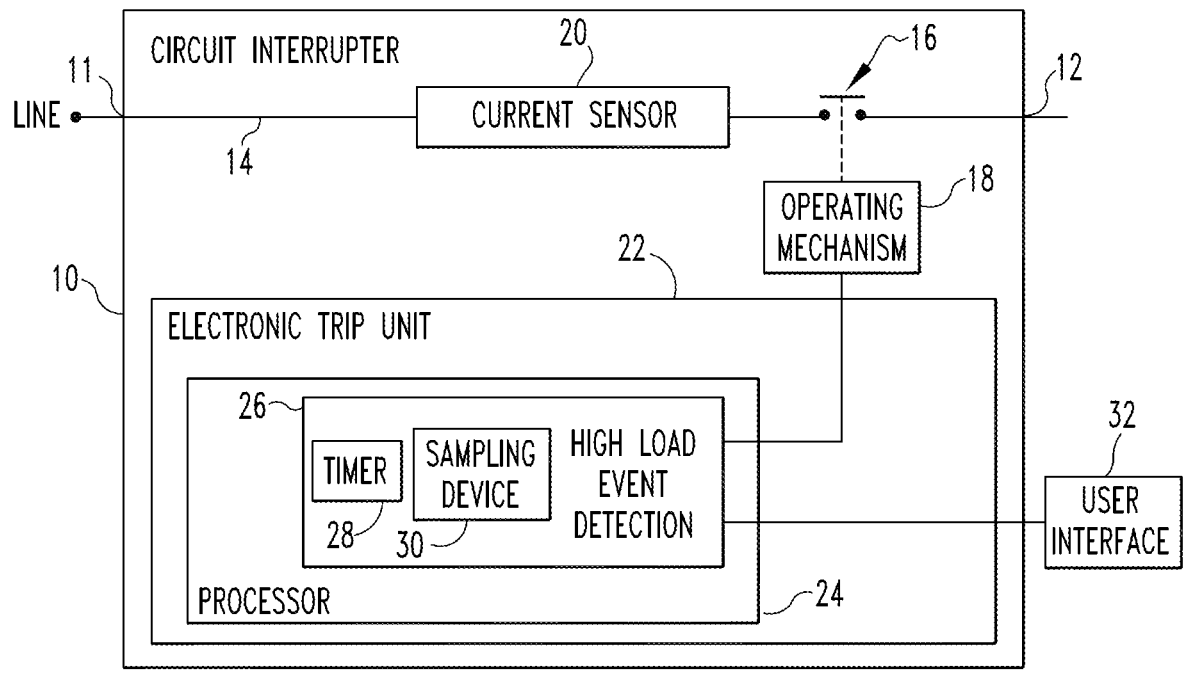
FIG. 1 is a schematic diagram of a circuit interrupter including a high load event detector in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As used herein, the singular form of "a", "an", and "the" include plural references unless the context clearly dictates otherwise.

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other. As used herein, "movably coupled" means that two components are coupled so as to allow at least one of the components to move in a manner such that the orientation of the at least one component relative to the other component changes.

As employed herein, the term "number" shall mean one or an integer greater than one (i.e., a plurality).

As employed herein, the term "processor" shall mean a programmable analog and/or digital device that can store, retrieve and process data; a controller; a control circuit; a computer; a workstation; a personal computer; a microprocessor; a microcontroller; a microcomputer; a central processing unit; a mainframe computer; a mini-computer; a server; a networked processor; or any suitable processing device or apparatus.

FIG. 1 is a schematic diagram of a circuit interrupter 10 in accordance with an example embodiment of the disclosed concept. The circuit interrupter 10 includes a first terminal 11, a second terminal 12, a line conductor 14 connecting the first terminal 11 and second terminal 12, separable contacts 16, and an operating mechanism 18. The line conductor 14 may be comprised of one or more busbars. The separable contacts 16 are disposed along the line conductor 14 such that tripping open the separable contacts 16 stops current from flowing through the line conductor 14 from the first terminal 11 to the second terminal 12. The operating mechanism 18 is structured to trip open the separable contacts 16.

The circuit interrupter 10 also includes a current sensor 20 structured and disposed to sense current flowing through the line conductor 14 (i.e., the busbars of the line conductor 14). However, it will be appreciated that the current sensor 20 may also be employed to sense current flowing through a neutral conductor without departing from the scope of the disclosed concept. The circuit interrupter 10 further includes an electronic trip unit 22 with a processor 24. Processor 24 may comprise, for example and without limitation, a microprocessor. The processor 24 includes a high load event detection module 26 with a timer 28 and sampling device 30 (detailed further herein), and is structured to receive the output of the current sensor 20 and to detect faults in the circuit interrupter 10 based on the sensed current. In response to detecting a fault, the electronic trip unit 22 is structured to cause the operating mechanism 18 to trip open the separable contacts 16. The high load event detection module 26 encompasses software and/or firmware instructions for executing high load event detection functions, as detailed herein with respect to the remaining figures. The data determined during high load event detection can be presented to a user of the circuit interrupter 10 by a user interface 32 configured to be in electrical communication with the trip unit processor 24. The user interface 32 may comprise, for example and without limitation, either a hardware component of the circuit interrupter 10 or a remote dashboard accessed via a remote computing device, or both.

Figure 2:
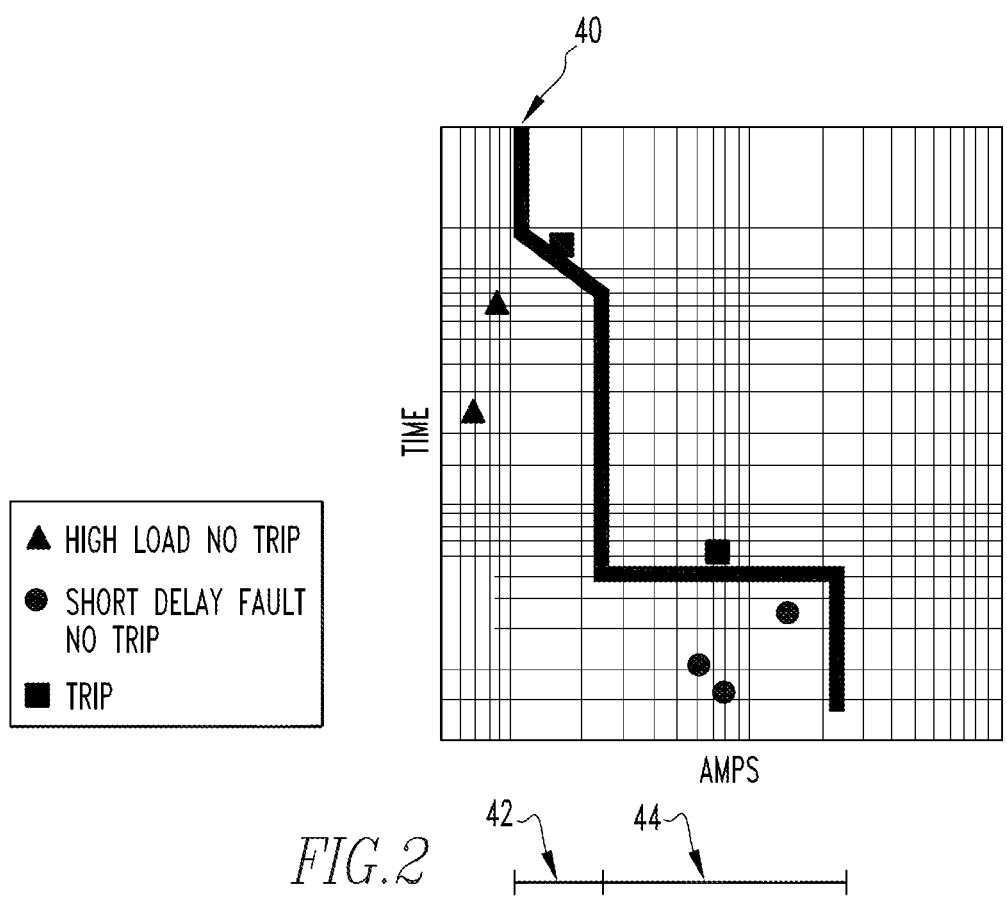
FIG. 2 is an illustrative example of a trip curve that can be used by the high load event detector shown in FIG. 1 in accordance with an example embodiment of the disclosed concept.

Referring now to FIG. 2, a graph of a high load trip curve 40 is shown. The high load detector 26 of circuit interrupter 10 is configured to determine, in accordance with a trip curve such as trip curve 40, how long a high load condition should be permitted to persist before the electronic trip unit 22 initiates a trip. The trip curve 40 plots time against RMS current ($I_{RMS}$) and depicts how quickly a trip will be initiated at various high load current levels. It should be noted that trip curve 40 is plotted logarithmically on both the x- and y-axes. The x-axis depicts current levels that are expressed as multiples of the current rating of circuit interrupter 10 such that, for a current rating of R, each increment on the x-axis can be expressed as nR, wherein n is an integer. The y-axis denotes the amount of time that has elapsed since the current flowing through the circuit interrupter 10 has reached a given amperage.

Still referring to FIG. 2 and trip curve 40, three different types of data points reflecting events captured by a high load detector 26 are displayed on the graph, as noted in the legend. The three types of data points displayed are: high load no trip (referred to hereinafter as "high load"), short delay fault no trip (referred to hereinafter as "short delay fault"), and trip. It should be noted that any values falling below trip curve 40 are indicative of current levels and durations that do not cause the trip unit 22 to initiate a trip, and that any values occurring above trip curve 40 are indicative of current levels and durations that do cause the trip unit 22 to initiate a trip. It will be appreciated that it is often desirable for circuit interrupters such as circuit interrupter 10 to have either or both short delay and long delay settings activated so that transient overcurrent conditions do not cause the circuit interrupter to trip, and the presence of both high load and short delay fault data points in FIG. 2 indicates activation of both short delay and long delay settings.

It will be further appreciated that relatively lower overcurrent conditions can be permitted to persist for a longer period of time before initiating a trip, and that relatively higher overcurrent conditions should only be permitted to persist for a short period of time before initiating a trip. In addition, the processor 24 may optionally be configured to store more than one trip curve 40 in memory such that a user may choose a trip curve 40 corresponding to a particular use or application of the circuit interrupter 10. The relatively lower overcurrent conditions that can persist for a longer period of time are referred to hereinafter as high load events, and the relatively higher overcurrent conditions that should only persist for a shorter period of time are referred to hereinafter as short delay faults. The left-hand portion of the trip curve 40 as denoted by reference number 42 is the region in which high load events occur, as data points falling under the trip curve 40 in this region have lower amperage values and correspond to more time having elapsed relative to the right-hand side of the curve 40. The right-hand portion of trip curve 40 denoted by reference number 44 is the region in which short delay faults occur, as data points falling under the trip curve 40 in this region have higher amperage values and correspond to less time having elapsed relative to the left-hand side of the curve 40. The innovations of the present disclosure are directed toward activity occurring in the high load region 42 rather than in the short delay fault region 44.

As previously stated, the high load detector 26 of circuit interrupter 10 is configured to determine, in accordance with a trip curve such as trip curve 40, how long an overcurrent condition should be permitted to persist before the electronic trip unit 22 initiates a trip. It is expected that current levels occurring above trip curve 40 may cause irreparable damage to components of the circuit interrupter 10 within a relatively short amount of time, which is why the trip data points in FIG. 2 occur just above the trip curve in both the high load region 42 and the short delay fault region 44. Current that reaches the magnitude of a predetermined threshold monitoring level triggers the timer 28 of high load detector 26. For each given level of current within the area under the trip curve 40 in FIG. 2, the given current level can continue to flow for a predetermined length of time (in accordance with the trip curve 40), as monitored by timer 28, before the trip unit 22 initiates a trip. The timer 28 is configured to run for as long as the current remains at or above the threshold monitoring level. In addition, the length of time that a given level of overcurrent can flow encompasses a tolerance level, as denoted by the thickness T of curve 40. For example and without limitation, if a high load current of 200 A should generally only be allowed to flow for 100 seconds before the trip unit 22 initiates a trip, for a chosen tolerance level of ±10%, a current of 200 A may cause a trip after flowing for as little as 90 seconds (90% of 100 s) or could flow for as long as 110 seconds (110% of 100 s) before causing a trip, depending on what other factors the trip unit 22 is programmed to take into account before initiating a trip.

Figure 3:
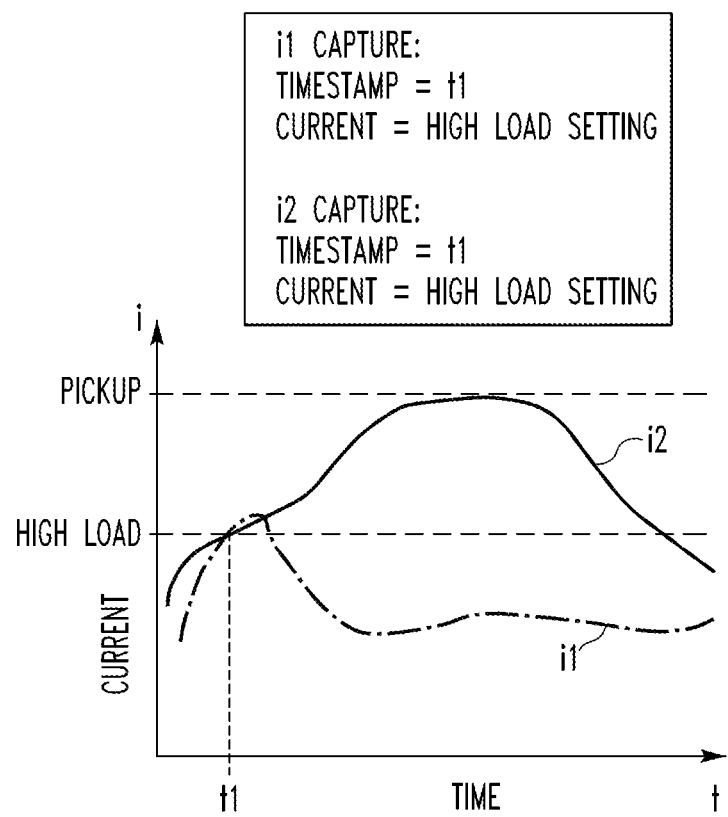
FIG. 3 is a graph of two current-time curves corresponding to two different high load events.

Referring to FIG. 3, two curves i1 and i2 are shown on a graph plotting current against time. Both curves i1 and i2 depict high load currents. Two levels of current, High Load and Pickup, are marked on the y-axis. High Load denotes an amperage level that is detected by the high load detector 26, and Pickup denotes an amperage level that will cause the trip unit 22 to initiate a trip. It will be appreciated that the regions of the graph in FIG. 3 can be related to the regions of the graph in FIG. 2. Specifically, current that reaches the High Load amperage level but does not reach the Pickup amperage level in FIG. 3 corresponds to the high load region 42 of FIG. 2, while current that reaches the Pickup amperage level in FIG. 3 corresponds to the values on the trip curve 40 in FIG. 2, and current that exceeds the Pickup amperage level in FIG. 3 corresponds to the region above the trip curve 40 in FIG. 2.

However, there is a notable difference between the data presented in the graph of FIG. 2 and the graph of FIG. 3. While the data points plotted in FIG. 2 depict the highest level of current that was reached before the overcurrent condition ceased or before a trip was initiated, existing electronic trip units only provide information about the overcurrent condition from time t1 of the graph in FIG. 3. That is, if an existing trip unit were to report the high load events depicted by i1 and i2 (referred to hereinafter as "event i1" and "event i2", respectively), for either of event i1 or event i2, said existing trip unit would simply report that a high load event occurred at time t1, i.e. the time when the curve i1 or i2 crossed the High Load threshold, and would provide a snapshot of the RMS current of event i1 or i2 at the starting time t1 of the high load condition. So, even though curve i1 and curve i2 follow significantly different trajectories after time t1, the information presented to a user by an existing trip unit would make it appear that event i1 and event i2 were nearly identical. In contrast and as detailed further herein, the electronic trip unit 22 of the disclosed circuit interrupter 10 performs an extended capture of the high load event and informs the user of various metrics of the high load event such as the maximum amperage reached during the event (i.e. the data presented in the High Load region 42 of FIG. 2) and the average high load current for the duration of the event, thus providing an improvement over high load monitoring performed by existing trip units.

Figure 4A:
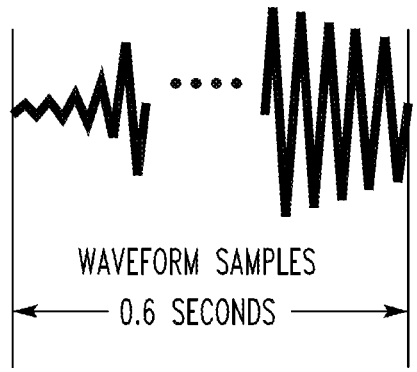
FIG. 4A shows a waveform capture of a high load event provided to a user of the circuit interrupter shown in FIG. 1, in accordance with an example embodiment of the disclosed concept.
Figure 4B:
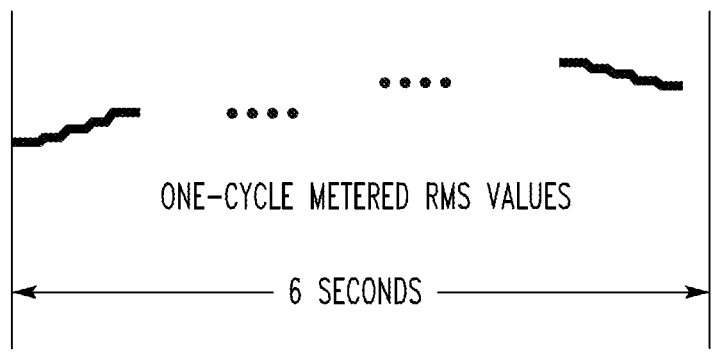
FIG. 4B shows a RMS capture of a high load event provided to a user of the circuit interrupter shown in FIG. 1, in accordance with an example embodiment of the disclosed concept.
Figure 4C:
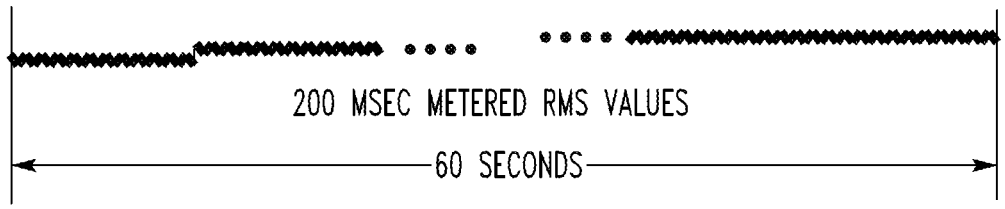
FIG. 4C shows an additional RMS capture of a high load event provided to a user of the circuit interrupter shown in FIG. 1, in accordance with an example embodiment of the disclosed concept.

Referring now to FIGS. 4A, 4B, and 4C, various data captures of an example high load 60 Hz current are shown, in accordance with exemplary embodiment of the disclosed concept. The captures shown in FIGS. 4A-4C are representative of data captured by the sampling device 30 of the electronic trip unit 22. FIG. 4A shows an abbreviated waveform capture of the high load current. Specifically, FIG. 4A depicts 0.6 seconds of AC waveform data such that 36 cycles of the 60 Hz current are depicted. The sampling device 30 samples at a rate of 80 samples/cycle. FIGS. 4B and 4C depict alternative metrics of the high load current, with each figure showing an abbreviated graph of metered values of the high load current, i.e. a collection of RMS values for a given interval of time. Specifically, for FIG. 4B, each data point in the graph denotes the RMS value of each individual cycle within a 6-second interval of the high load current signal. For FIG. 4C, the graph depicts an interval of 60 seconds divided into 200-ms periods, and each data point in the graph denotes the RMS value of the high load current for a corresponding 200-ms period.

It will be appreciated that the combination of the three different data captures shown in FIGS. 4A-4C provides a well-rounded depiction of the high load event, as the three measurements encompass varying degrees of the trade-off between data resolution and duration. It will be appreciated that time intervals and sampling rates used in FIGS. 4A-4C are intended to be non-limiting illustrative examples, and that time intervals and sampling rates other than those used to generate the data captures shown in FIGS. 4A-4C can be used to generate useful data captures without departing from the scope of the disclosed concept.

Detailed high load data determined by the high load event detector 26, such as the waveform captures and RMS metered values shown in FIGS. 4A-4C, can be displayed on the user interface 32. In particular, said detailed high-load data can be displayed in graphical format alongside the relevant trip curve 40, allowing the high-load data to be easily compared to the trip curve 40. Presenting said detailed high load data and/or presenting a comparison against a trip curve 40 constitutes a significant benefit provided by the systems and methods disclosed herein, as existing circuit breaker trip units provide limited information about high load conditions. In existing breakers, the presence of a high-load current is indicated, but these captures only denote the time of the entry into the high-load condition and a snapshot of the RMS current at the time of entry into the high load condition. In these existing systems, a user is presented with nearly identical high load event captures for two drastically differing high load currents, as previously detailed with respect to curves i1 and i2 in FIG. 3. This limited data capture provided by existing trip units leaves a significant gap in the information available to the user, as the user cannot tell whether the high load condition was relatively transient or whether the high-load current steadily increased in RMS value over the duration of the event. Furthermore, it should be noted that the plurality of event metrics discussed herein, i.e. waveform captures and multiple groups of metered RMS value data points for a given high load event, are generated by the single sampling device 30 of processor 24. The ability of the single sampling device 30 to generate both waveform captures and multiples groups of metered RMS value data points for a given high load event, rather than necessitating multiple sampling devices, is another benefit provided by the systems and methods disclosed herein relative to existing trip units.

Figure 5:
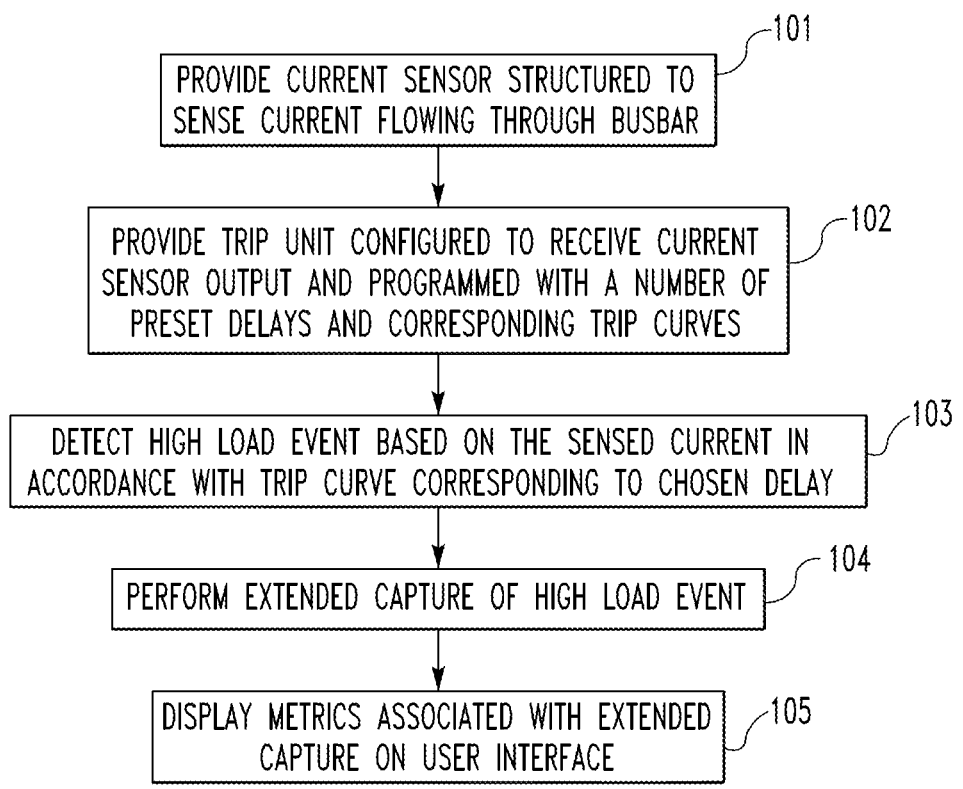
FIG. 5 is a flow chart of a method for providing detailed information about high load events to a user of a circuit interrupter in accordance with example embodiments of the disclosed concept.

Referring now to FIG. 5, a flowchart of a method 100 for informing a user of a circuit interrupter of the details of high-load conditions is shown, in accordance with an example embodiment of the disclosed concept. The method of FIG. 5 may be employed, for example, with the circuit interrupter 10 shown in FIG. 1 and the user interface 32 shown in FIG. 1, with trip curves such as trip curve 40 shown in FIG. 2, and with data captures such as those shown in FIGS. 4A-4C, and the method is described in conjunction with the circuit interrupter 10, user interface 32, trip curve 40, and data captures shown in FIGS. 1, 2, 3, and 4A-4C. However, it will be appreciated that the method may be employed in other devices as well without departing from the scope of the disclosed concept.

The method begins at 101 where the current sensor 20 is provided and disposed around the line conductor busbar 14 of the circuit interrupter 10 in order to sense the current flowing through the busbar 14. At 102, the electronic trip unit 22 is provided such that the high load event detector 26 is configured to receive the output of the current sensor 20, and the high load event detector 26 is programmed with a number of stored preset high load delays and a corresponding number of trip curves 40 such that each preset delay has an associated trip curve 40. At 103, the high load event detector 26 detects a high load condition in the circuit interrupter 10 based on the sensed current and in accordance with the trip curve corresponding to the preset delay chosen by the user. At 104, the high load event detector 26 performs an extended capture of the high load event. Performing said extended capture may comprise, for example and without limitation, sampling data points from the high load current AC waveform and producing metered RMS values for various intervals of time, in order to obtain the data needed to produce graphs such as the graphs shown in FIGS. 4A-4C.

At 105, after the current exits the high load condition, the high load event detector 26 displays a number of metrics of the high load event on the user interface 32, said metrics being based on the data collected during the extended capture performed at step 104. Said metrics displayed at step 105 may, for example and without limitation, be presented in the form of waveform and/or meter captures, such as those shown in FIGS. 4A-4C, and may also include information such as the maximum high load current reached during the high load event, or the average high load current calculated for the duration of the high load event. It will be appreciated that the current can exit the high-load condition either by decreasing below the high load threshold amperage, or by increasing to a pickup level amperage that causes the trip unit 22 to initiate a trip. In the event that exiting the high load condition constitutes the current decreasing below the high load threshold, the duration of the high load event spans from the time that the current meets the high load threshold to the time that the current decreases below the high load threshold. In the event that exiting the high load condition constitutes the current increasing until a trip is initiated, the duration of the high load event spans from the time that the current meets the high load threshold to the time that the trip is initiated.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An electronic trip unit for a circuit interrupter, the electronic trip unit comprising:
   a processor comprising a timer and structured to receive an output of a current sensor sensing current flowing through a busbar of the circuit interrupter; and
   a user interface,
   wherein the processor is configured to detect a high load condition in the circuit interrupter based on the sensed current,
   wherein, after detection of the high load condition, the processor is configured to capture a plurality of metrics of the high load condition,
   wherein the plurality of metrics are based on data captured throughout the entire duration of the high load condition,
   wherein the processor is configured to display the plurality of metrics on the user interface,
   wherein the plurality of metrics includes:
      a group of single-cycle metered values, the group of single-cycle metered values comprising a plurality of metered values for a corresponding plurality of successive single cycles of the sensed current, with each metered value in the group of single-cycle metered values being an RMS current value calculated for a corresponding unique one cycle of the sensed current, and
      a group of multiple-cycle metered values, the group of multiple-cycle metered values comprising a plurality of metered values for multiple cycles of the sensed current, each metered value in the group of multiple-cycle metered values being an RMS current value calculated for multiple successive cycles of the sensed current, and
   wherein the group of single-cycle metered values spans a first interval of time and the group of multiple-cycle metered values spans a second interval of time, and the first interval of time and the second interval of time are not equal in length.

2. The electronic trip unit of claim 1, wherein the plurality of metrics comprises a sampled waveform of the sensed current.

3. The electronic trip unit of claim 1,
   wherein the processor is configured to store a number of preset delays,
   wherein the processor is configured to store a number of trip curves corresponding in number to the number of preset delays such that each trip curve is associated with a corresponding preset delay,
   wherein the electronic trip unit is configured to enable a user to choose one of the preset delays,
   wherein each trip curve determines a corresponding threshold level of current that indicates whether a high load condition exists.

4. The electronic trip unit of claim 3,
   wherein the processor is configured to display, on the user interface, the plurality of metrics alongside the trip curve corresponding to the chosen preset delay.

5. A circuit interrupter comprising:
   a first terminal and a second terminal;
   a busbar disposed between the first terminal and the second terminal;
   separable contacts structured to be moveable between a closed position and an open position, the first and second terminals being electrically disconnected from each other when the separable contacts are in the open position;

an operating mechanism structured to open and close the separable contacts;
a current sensor configured to sense current flowing through the busbar;
a user interface; and
an electronic trip unit structured to actuate the operating mechanism, the electronic trip unit comprising:
a processor comprising a timer and structured to receive an output of the current sensor;
wherein the processor is configured to detect a high load condition in the circuit interrupter based on the sensed current,
wherein, after detection of the high load condition, the processor is configured to capture a plurality of metrics of the high load condition,
wherein the plurality of metrics are based on data captured throughout the entire duration of the high load condition,
wherein the processor is configured to display the plurality of metrics on the user interface,
wherein the plurality of metrics includes:
a group of single-cycle metered values, the group of single-cycle metered values comprising a plurality of metered values for a corresponding plurality of successive single cycles of the sensed current, with each metered value in the group of single-cycle metered values being an RMS current value calculated for a corresponding unique one cycle of the sensed current, and
a group of multiple-cycle metered values, the group of multiple-cycle metered values comprising a plurality of metered values for multiple cycles of the sensed current, each metered value in the group of multiple-cycle metered values being an RMS current value calculated for multiple successive cycles of the sensed current, and
wherein the group of single-cycle metered values spans a first interval of time and the group of multiple-cycle metered values spans a second interval of time, and the first interval of time and the second interval of time are not equal in length.

6. The circuit interrupter of claim 5, wherein the plurality of metrics comprises a sampled waveform of the sensed current.

7. The circuit interrupter of claim 5,
wherein the processor is configured to store a number of preset delays,
wherein the processor is configured to store a number of trip curves corresponding in number to the number of preset delays such that each trip curve is associated with a corresponding preset delay,
wherein the electronic trip unit is configured to enable a user to choose one of the preset delays,
wherein each trip curve determines a corresponding threshold level of current that indicates whether a high load condition exists.

8. The electronic trip unit of claim 7,
wherein the processor is configured to display, on the user interface, the plurality of metrics alongside the trip curve corresponding to the chosen preset delay.

9. A method of informing a user of a circuit interrupter that a high load condition is present in the circuit interrupter, the method comprising:
providing a current sensor structured to sense current flowing through a busbar of the circuit interrupter;
providing an electronic trip unit, the electronic trip unit comprising:
a processor comprising a timer and structured to receive an output of the current sensor; and
a user interface,
detecting, with the processor, a high load condition in the circuit interrupter based on the sensed current;
capturing, with the processor, a plurality of metrics of the high load condition; and
displaying the plurality of metrics on the user interface,
wherein the plurality of metrics are based on data captured throughout the entire duration of the high load condition,
wherein the plurality of metrics includes:
a group of single-cycle metered values, the group of single-cycle metered values comprising a plurality of metered values for a corresponding plurality of successive single cycles of the sensed current, with each metered value in the group of single-cycle metered values being an RMS current value calculated for a corresponding unique one cycle of the sensed current, and
a group of multiple-cycle metered values, the group of multiple-cycle metered values comprising a plurality of metered values for multiple cycles of the sensed current, each metered value in the group of multiple-cycle metered values being an RMS current value calculated for multiple successive cycles of the sensed current, and
wherein the group of single-cycle metered values spans a first interval of time and the group of multiple-cycle metered values spans a second interval of time, and the first interval of time and the second interval of time are not equal in length.

10. The method of claim 9, wherein the plurality of metrics comprises a sampled waveform of the sensed current.

11. The method of claim 9, further comprising:
storing a number of preset delays in the processor;
storing a number of trip curves in the processor corresponding to the number of preset delays such that each trip curve is associated with a corresponding preset delay; and
enabling a user to choose one of the preset delays,
wherein each trip curve determines a corresponding threshold level of current that indicates whether a high load condition exists.

12. The method of claim 11, further comprising:
displaying, on the user interface, the plurality of metrics alongside the trip curve corresponding to the chosen preset delay.

* * * * *